United States Patent
Schultz et al.

(10) Patent No.: US 8,662,764 B2
(45) Date of Patent: Mar. 4, 2014

(54) CAMERA POSITIONING MECHANISM USING AN ANTAGONISTIC PAIR OF COMPLIANT CONTRACTILE ACTUATORS

(71) Applicant: Georgia Tech Research Corporation, Atlanta, GA (US)

(72) Inventors: Joshua Andrew Schultz, Atlanta, GA (US); Jun Ueda, Duluth, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/918,109

(22) Filed: Jun. 14, 2013

(65) Prior Publication Data

US 2013/0336644 A1    Dec. 19, 2013

Related U.S. Application Data

(60) Provisional application No. 61/659,614, filed on Jun. 14, 2012.

(51) Int. Cl.
*G03B 17/00* (2006.01)
*G03B 5/00* (2006.01)

(52) U.S. Cl.
CPC .................................... *G03B 5/00* (2013.01)
USPC ....................................................... 396/428

(58) Field of Classification Search
CPC ......................................................... G03B 5/00
USPC ....................................................... 396/428
See application file for complete search history.

(56) References Cited

U.S. PATENT DOCUMENTS

| | | | |
|---|---|---|---|
| 5,633,681 A | 5/1997 | Baxter et al. | |
| 5,768,016 A * | 6/1998 | Kanbara | 359/557 |
| 6,134,057 A * | 10/2000 | Ueyama et al. | 359/821 |
| 6,465,936 B1 * | 10/2002 | Knowles et al. | 310/328 |
| 6,943,843 B2 | 9/2005 | Boyden et al. | |
| 7,866,900 B2 * | 1/2011 | Tanaka | 396/428 |
| 7,960,896 B2 * | 6/2011 | Takahashi et al. | 310/323.01 |
| 2003/0001963 A1 * | 1/2003 | Masuyama et al. | 348/374 |
| 2008/0080064 A1 * | 4/2008 | Kogo et al. | 359/696 |
| 2008/0247748 A1 * | 10/2008 | Tanimura et al. | 396/502 |
| 2009/0039734 A1 * | 2/2009 | Takahashi et al. | 310/323.02 |
| 2009/0052037 A1 * | 2/2009 | Wernersson | 359/554 |
| 2009/0115292 A1 * | 5/2009 | Ueda et al. | 310/338 |
| 2012/0263446 A1 | 10/2012 | Dumm | |
| 2013/0101276 A1 | 4/2013 | Keller et al. | |
| 2013/0321581 A1 * | 12/2013 | El-Ghoroury et al. | 348/46 |

OTHER PUBLICATIONS

Ueda, Jun: "Large Effective-Strain Piezoelectric Actuators Using Nested Cellular Architecture With Exponential Strain Amplification Mechanisms"; IEEE/ASME Transactions on Mechatronics, vol. 15, No. 5, Oct. 2010; pp. 770-782.

* cited by examiner

*Primary Examiner* — Rodney Fuller
(74) *Attorney, Agent, or Firm* — Bryan W. Bockhop; Bockhop & Associates, LLC

(57) ABSTRACT

In a method of controlling a gaze direction of a camera, the camera is placed on a top surface of a substrate that is pivotally coupled to a frame, wherein a movement arm depends downwardly from the substrate. The movement arm is moved with two spaced apart amplified piezoelectric ceramic stack actuators that are affixed to the frame and coupled to the movement arm by deforming the amplified piezoelectric ceramic stack actuators as a result of applying a voltage thereto, thereby changing an angular orientation of the substrate.

20 Claims, 2 Drawing Sheets

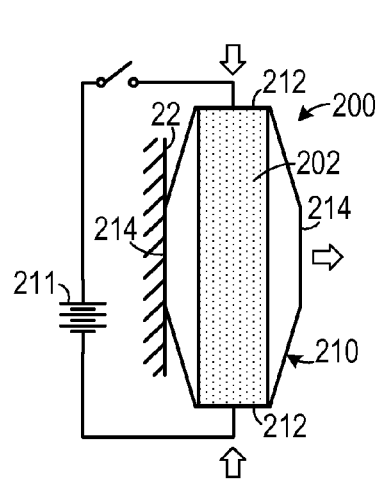
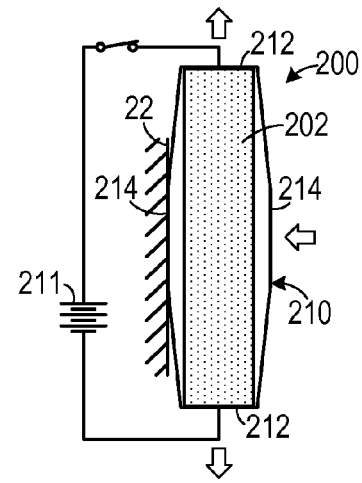
FIG. 3A  FIG. 3B
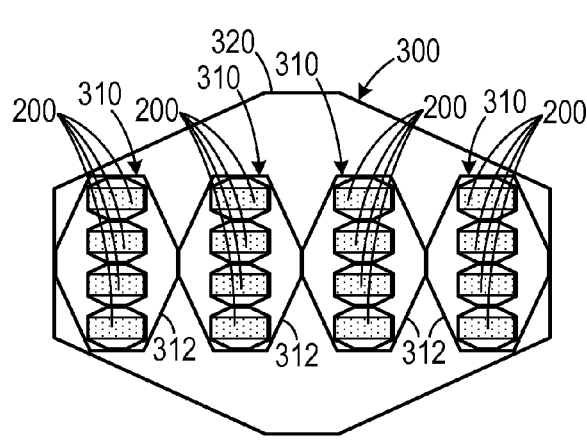
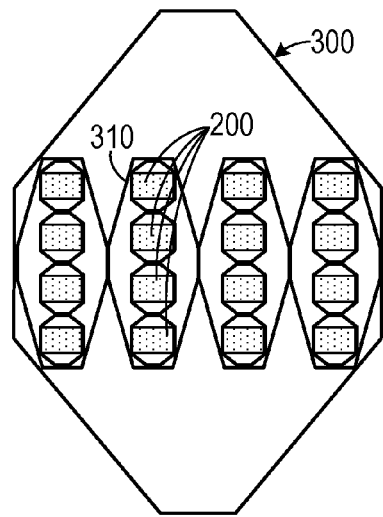
FIG. 4A  FIG. 4B

CAMERA POSITIONING MECHANISM USING AN ANTAGONISTIC PAIR OF COMPLIANT CONTRACTILE ACTUATORS

CROSS-REFERENCE TO RELATED APPLICATION(S)

This application claims the benefit of U.S. Provisional Patent Application Ser. No. 61/659,614, filed Jun. 14, 2012, the entirety of which is hereby incorporated herein by reference.

STATEMENT OF GOVERNMENT INTEREST

This invention was made with government support under agreement No. ECCS-0932208, awarded by National Science Foundation. The government has certain rights in the invention.

BACKGROUND OF THE INVENTION

1. Field of the Invention

The present invention relates to camera positioning systems and, more specifically, to a camera positioning system using antagonistic actuators.

2. Description of the Related Art

The human eye enables the brain to perceive large amounts of information quickly, yet not all regions of space are perceived equally. Objects near the gaze direction, or fovea, receive the most attention, a lesser amount of information is gathered about objects in the remainder of the field of view, and some objects are out of the field of view and are not perceived. In this way, the brain is not overwhelmed by information that is not of interest. Because the area of interest may change rapidly, the eye can be reoriented with astounding performance by lightweight recti muscles. The recti muscles are contractile, compliant actuators that are activated in discrete steps by neural impulses.

The human eyeball, or globe, is oriented by means of antagonistic pairs of recti and oblique muscles. The range of achievable orientations follows Donders' Law and Listing's law, both for saccadic motion and smooth pursuit. Antagonistic pairs of contractile actuators with insertion points into the globe are an important part of the eye's kinematics. In actuality, eye muscles consist of a finite number of on-off motor units, or collection of muscle fibers innervated by a particular motor neuron. Cytoskeletal tissue couples the active acto-myosin filaments to the load. It is believed that this property allows muscles to function well in unstructured environments, since the elasticity of the muscle tends to return to a stable equilibrium when perturbed. Muscles are controlled by recruitment, whereby the nervous system increases or decreases the number of motor units active to increase or decrease the amount of actuation. Each individual motor unit can only be on or off and it cannot be proportionally controlled.

Most camera positioners use heavy traditional servo-motors. One example employs a cable-driven mechanism that is actuated by traditional servomotors. A cable-driven eye may be able to enforce the eye's kinematics, but rigid servomotors do not actually follow the processes related to the neurological basis for natural eye motion. This is partly because servomotors tend to introduce velocity saturations and backlash. The resulting movement lacks the bandwidth of an actual eye.

Therefore, there is a need for a camera positioning system the models natural eye movement.

SUMMARY OF THE INVENTION

The disadvantages of the prior art are overcome by the present invention which, in one aspect, is a camera system that includes a frame that supports a substrate in a pivotal relationship along a first axis. A camera is disposed on the substrate. A first actuator is affixed to a first side the frame and is disposed along a second axis that is transverse to the first axis. A second actuator is affixed to a second side of the frame and is disposed along the second axis. The second side of the frame is opposite the first side of the frame so that the substrate is between the first side of the frame and the second side of the frame. The first actuator and the second actuator are both deformable in response to a signal. When the first actuator deforms away from the first side of the frame, the second actuator deforms toward the second side of the frame and when the first actuator deforms toward from the first side of the frame, the second actuator deforms away from the second side of the frame. A transverse member is disposed along a second axis that is transverse to the first axis. The transverse member mechanically couples the first actuator and the second actuator to the frame. The transverse member imparts deformation of the first actuator and the second actuator to the substrate in response to the signal so as to cause the substrate to pivot in relation to the frame, thereby changing an angular orientation of the camera.

In another aspect, the invention is a directional device that includes a frame that supports a substrate in a pivotal relationship along a first axis. A first amplified piezoelectric ceramic stack actuator is affixed to a first side the frame and is disposed along a second axis, transverse to the first axis. A second amplified piezoelectric ceramic stack actuator is affixed to a second side of the frame and is disposed along the second axis. The second side of the frame is opposite the first side of the frame so that the substrate is between the first side of the frame and the second side of the frame. The first amplified piezoelectric ceramic stack actuator and the second amplified piezoelectric ceramic stack actuator are both mable in response to a signal. When the first amplified piezoelectric ceramic stack actuator deforms away from the first side of the frame, the second amplified piezoelectric ceramic stack actuator deforms toward the second side of the frame. When the first amplified piezoelectric ceramic stack actuator deforms toward from the first side of the frame, the second amplified piezoelectric ceramic stack actuator deforms away from the second side of the frame. A transverse member is disposed along a second axis that is transverse to the first axis. The transverse member mechanically couples the first amplified piezoelectric ceramic stack actuator and the second amplified piezoelectric ceramic stack actuator to the frame. The transverse member imparts deformation of the first amplified piezoelectric ceramic stack actuator and the second amplified piezoelectric ceramic stack actuator to the substrate in response to the signal so as to cause the substrate to pivot in relation to the frame to a predetermined orientation.

In yet another aspect, the invention is a method of controlling a gaze direction of a camera, in which the camera is placed on a top surface of a substrate that is pivotally coupled to a frame, wherein a movement arm depends downwardly from the substrate. The movement arm is moved with two spaced apart amplified piezoelectric ceramic stack actuators that are affixed to the frame and coupled to the movement arm by deforming the amplified piezoelectric ceramic stack actuators as a result of applying a voltage thereto, thereby changing an angular orientation of the substrate.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 3A is a schematic diagram of a single cell of an amplified piezoelectric ceramic stack actuator unit in a non-deformed state.

FIG. 3B is a schematic diagram of a single cell of an amplified piezoelectric ceramic stack actuator unit in a deformed state.

FIG. 4A is a schematic diagram of an actuator with three levels of amplification in a non-deformed state.

FIG. 4B is a schematic diagram of an actuator with three levels of amplification in a deformed state.

DETAILED DESCRIPTION OF THE INVENTION

Figure 1A:
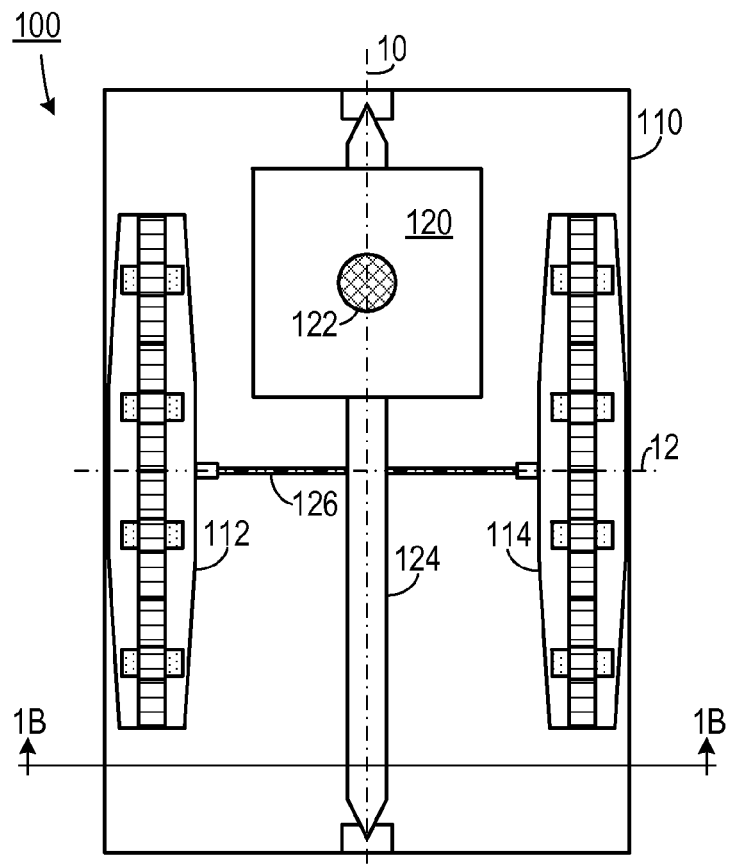
FIG. 1A is a plan view schematic diagram of one embodiment of a camera system.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1B:
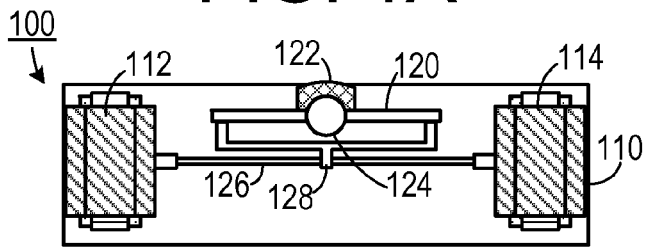
FIG. 1B is a cross-sectional schematic view of the embodiment shown in FIG. 1A, taken along line 1B-1B.

As shown in FIGS. 1A-1B, one embodiment of a camera positioning system 100 employs a frame 110 on which is mounted a substrate 120. A pivot rod 124 pivotally couples the substrate 120 to the frame 110 along a first axis 10. A camera 122 may be mounted on the substrate 120. (It should be recognized that other embodiments may be employed to position objects other than cameras.) A movement arm 128 depends downwardly from the substrate 120. A first actuator 112 is mounted to a first side of the frame 110 and a second actuator 114 is mounted to a second, opposite, side of the frame 110. A transverse member 126 is disposed along a second axis 12 that is transverse to the first axis 10 and that mechanically couples the first actuator 112 and the second actuator 114 to the substrate 120. The transverse member 126 imparts the deformation of the first actuator 112 and the second actuator 114 to the substrate 120 in response to the signal so as to cause the substrate 120 to pivot in relation to the frame 110, which changes the angular orientation of the camera.

Figure 2:
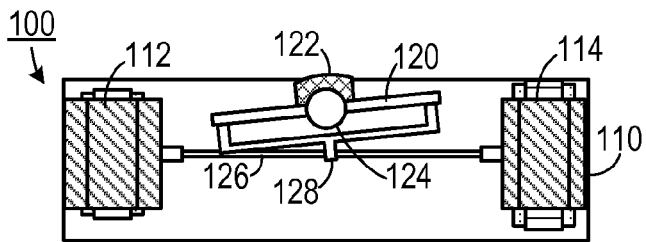
FIG. 2 is a cross-sectional schematic view of the embodiment shown in FIG. 1A showing a result of deformation of the actuators.

The first actuator 112 and the second actuator 114 are both deformable in response to a signal (such as a voltage signal). As shown in FIG. 2, when the first actuator deforms 112 away from the first side of the frame 110, the second actuator 114 deforms toward the second side of the frame 110, which causes the transverse member 126 to move toward the second side of the frame 110. As a result, the movement arm 128 is displaced along with the transverse member 126, which causes the substrate 120 to rotate in a counter-clockwise direction. Similarly, when a signal of opposite polarity is applied to the first actuator 112 and to the second actuator 114, the first actuator 112 deforms toward from the first side of the frame 110 and the second actuator 114 deforms away from the second side of the frame 110, which causes the transverse member 126 to move toward the first side of the frame 110, thereby causing clockwise rotation of the substrate 110.

In one embodiment, the actuators 112 and 114 include amplified piezoelectric ceramic stack actuators, such as an actuator employing a lead zirconate titanate (PZT) ceramic (which is contractile along one axis when a voltage is applied thereto). One method of making and using amplified piezoelectric ceramic stack actuators is disclosed in "Strain Amplification Devices and Methods," U.S. Patent Application Publication No. 2009/0115292 A1, published on May 7, 2009 and filed by Ueda et al. on Oct. 24, 2008, the entirety of which is incorporated herein by reference for the purpose of disclosing amplified piezoelectric ceramic stack actuators and methods of making, using and controlling the same.

As shown in FIGS. 3A and 3B, a simple piezoelectric ceramic stack actuator 200 employs a piezoelectric element 202 that deforms in at least one direction when a voltage 211 is applied thereto. The piezoelectric element 202 is surrounded by a flexible loop 210, which includes two first opposite surfaces 212 and two second opposite surfaces 214 that are disposed transversely to the two first opposite surfaces 212. One of the second opposite surfaces 214 is affixed to a fixed surface 22 (such as a frame). The flexible loop 210 can be made of a flexible material such as a metal strip or a plastic and can take the form of a non-regular octagon (it should be understood that many other shapes, such as an oval, could also be used). When the voltage 211 is applied to the piezoelectric element 202, as shown in FIG. 3B, the piezoelectric element expands and forces the two first opposite surfaces 212 apart, which forces two second opposite surfaces 214 closer together. Because of the angular differences of the sides of the flexible loop 210, the somewhat limited expansion of the piezoelectric element 202 is amplified to substantially more movement between the two second opposite surfaces 214.

As shown in FIGS. 4A and 4B, this amplification can be exaggerated by nesting piezoelectric ceramic stack actuators 200 in flexible loops to make an amplified actuator 300. In this embodiment, several piezoelectric ceramic actuators 200 are stacked adjacently to each other, with a peripheral flexible loop 312 surrounding the stack thereby forming an amplified actuator unit 310. Several actuator units 310 can then be stacked and an outer flexible loop 320 can be placed around them to form a complex actuator 300. Because of the angular relationships of the sides of loops 312 and 320, a substantial amount of displacement between the sides of the complex actuator 300 can be achieved with relatively little displacement of the piezoelectric elements in the ceramic actuators 200. Also, by applying a voltage to only selected ones of the ceramic actuators 200, the amount of displacement the complex actuator 300 can be controlled with a relatively high level of precision. This mimics the way contraction of muscle fibers control movement of such things as eyeballs.

While above embodiment shows a single degree of freedom positioning system, this system could employ gimbals to achieve multiple degrees of freedom The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A camera system, comprising:
   (a) a frame that supports a substrate in a pivotal relationship along a first axis;
   (b) a camera disposed on the substrate;
   (c) a first actuator affixed to a first side the frame and disposed along a second axis, transverse to the first axis, and a second actuator affixed to a second side of the frame and disposed along the second axis, the second side of the frame opposite the first side of the frame so that the substrate is between the first side of the frame and the second side of the frame, the first actuator and the second actuator both deformable in response to a signal so that when the first actuator deforms away from the first side of the frame, the second actuator deforms toward the second side of the frame and so that when the first actuator deforms toward from the first side of the frame, the second actuator deforms away from the second side of the frame; and
   (d) a transverse member, disposed along a second axis that is transverse to the first axis, that mechanically couples the first actuator and the second actuator to the substrate and that is configured to impart deformation of the first actuator and the second actuator to the substrate in response to the signal so as to cause the substrate to pivot in relation to the frame, thereby changing an angular orientation of the camera.

2. The camera system of claim 1, wherein at least one of the first actuator and the second actuator comprises an amplified piezoelectric ceramic stack actuator.

3. The camera system of claim 2, wherein the amplified piezoelectric ceramic stack actuator comprises:
   (a) a flexible loop including two first opposite surfaces and two second opposite surfaces that are oriented transversely to the two first opposite surfaces; and
   (b) at least one piezoelectric element disposed within the flexible loop and having an orientation so as to be in contact with the two first opposite surfaces of the flexible loop, the piezoelectric element configured to exert force on the two first opposite surfaces when a predetermined voltage is applied thereto, thereby causing the two first opposite surfaces to move apart from each other and thereby causing the two second opposite surfaces to move closer to each other.

4. The camera system of claim 3, wherein the flexible loop comprises a non-regular octagonal loop.

5. The camera system of claim 3, wherein the piezoelectric element comprises a lead zirconate titanate ceramic.

6. The camera system of claim 2, wherein the amplified piezoelectric ceramic stack actuator includes at least one amplified unit that comprises:
   (a) a plurality of adjacent actuator units, each actuator unit including:
      (i) a flexible loop including two first opposite surfaces and two second opposite surfaces that are oriented transversely to the two first opposite surfaces; and
      (ii) at least one piezoelectric element disposed within the flexible loop and having an orientation so as to be in contact with the two first opposite surfaces of the flexible loop, the piezoelectric element configured to exert force on the two first opposite surfaces when a predetermined voltage is applied thereto, thereby causing the two first opposite surfaces to move apart from each other and thereby causing the two second opposite surfaces to move closer to each other
      wherein each of the plurality of adjacent actuator units is oriented so that the second opposite surfaces of each flexible loop is touching a second opposite surface of an adjacent flexible loop; and
   (b) a peripheral flexible loop including two peripheral first opposite surfaces and two peripheral second opposite surfaces that are oriented transversely to the two peripheral first opposite surfaces, wherein the two peripheral second opposite surfaces are touching second opposite surfaces of end ones of the plurality of adjacent actuator units,
      wherein application of a predetermined voltage to at least one of the actuator units causes two of the second opposite surfaces to be drawn inwardly, thereby causing the two peripheral second opposite surfaces to be drawn inwardly, thereby forcing the two peripheral first opposite surfaces apart from each other.

7. The camera system of claim 6, wherein the amplified piezoelectric ceramic stack actuator comprises a plurality of adjacent amplified units that are surrounded by an outer flexible loop.

8. The camera system of claim 6, wherein the piezoelectric element comprises a lead zirconate titanate ceramic.

9. The camera system of claim 6, wherein each of the flexible loops comprises a non-regular octagonal loop.

10. A directional device, comprising:
    (a) a frame that supports a substrate in a pivotal relationship along a first axis.
    (b) a first amplified piezoelectric ceramic stack actuator affixed to a first side the frame and disposed along a second axis, transverse to the first axis, and a second amplified piezoelectric ceramic stack actuator affixed to a second side of the frame and disposed along the second axis, the second side of the frame opposite the first side of the frame so that the substrate is between the first side of the frame and the second side of the frame, the first amplified piezoelectric ceramic stack actuator and the second amplified piezoelectric ceramic stack actuator both deformable in response to a signal so that when the first amplified piezoelectric ceramic stack actuator deforms away from the first side of the frame, the second amplified piezoelectric ceramic stack actuator deforms toward the second side of the frame and so that when the first amplified piezoelectric ceramic stack actuator deforms toward from the first side of the frame, the second amplified piezoelectric ceramic stack actuator deforms away from the second side of the frame; and
    (c) a transverse member, disposed along a second axis that is transverse to the first axis, that mechanically couples the first amplified piezoelectric ceramic stack actuator and the second amplified piezoelectric ceramic stack actuator to the substrate and that is configured to impart deformation of the first amplified piezoelectric ceramic stack actuator and the second amplified piezoelectric ceramic stack actuator to the substrate in response to the signal so as to cause the substrate to pivot in relation to the frame to a predetermined orientation.

11. The directional device of claim 10, further comprising a camera mounted on the substrate, wherein the predetermined orientation determines a gaze direction of the camera.

12. The directional device of claim 10, wherein the amplified piezoelectric ceramic stack actuator comprises:

(a) a flexible loop including two first opposite surfaces and two second opposite surfaces that are oriented transversely to the two first opposite surfaces; and (b) at least one piezoelectric element disposed within the flexible loop and having an orientation so as to be in contact with the two first opposite surfaces of the flexible loop, the piezoelectric element configured to exert force on the two first opposite surfaces when a predetermined voltage is applied thereto, thereby causing the two first opposite surfaces to move apart from each other and thereby causing the two second opposite surfaces to move closer to each other.

13. The directional device of claim 12, wherein the flexible loop comprises a non-regular octagonal loop.

14. The directional device of claim 12, wherein the piezoelectric element comprises a lead zirconate titanate ceramic.

15. The directional device of claim 10, wherein the amplified piezoelectric ceramic stack actuator includes at least one amplified unit that comprises:

(a) a plurality of adjacent actuator units, each actuator unit including:

(i) a flexible loop including two first opposite surfaces and two second opposite surfaces that are oriented transversely to the two first opposite surfaces; and (ii) at least one piezoelectric element disposed within the flexible loop and having an orientation so as to be in contact with the two first opposite surfaces of the flexible loop, the piezoelectric element configured to exert force on the two first opposite surfaces when a predetermined voltage is applied thereto, thereby causing the two first opposite surfaces to move apart from each other and thereby causing the two second opposite surfaces to move closer to each other, wherein each of the plurality of adjacent actuator units is oriented so that the second opposite surfaces of each flexible loop is touching a second opposite surface of an adjacent flexible loop; and (b) a peripheral flexible loop including two peripheral first opposite surfaces and two peripheral second opposite surfaces that are oriented transversely to the two peripheral first opposite surfaces, wherein the two peripheral second opposite surfaces are touching second opposite surfaces of end ones of the plurality of adjacent actuator units, wherein application of a predetermined voltage to at least one of the actuator units causes two of the second opposite surfaces to be drawn inwardly, thereby causing the two peripheral second opposite surfaces to be drawn inwardly, thereby forcing the two peripheral first opposite surfaces apart from each other.

16. The directional device of claim 15, wherein the amplified piezoelectric ceramic stack actuator comprises a plurality of adjacent amplified units that are surrounded by an outer flexible loop.

17. The directional device of claim 15, wherein the piezoelectric element comprises a lead zirconate titanate ceramic.

18. The directional device of claim 15, wherein each of the flexible loops comprises a non-regular octagonal loop.

19. A method of controlling a gaze direction of a camera, comprising the steps of:

(a) placing the camera on a top surface of a substrate that is pivotally coupled to a frame, wherein a movement arm depends downwardly from the substrate; and (b) moving the movement arm with two spaced apart amplified piezoelectric ceramic stack actuators that are affixed to the frame and coupled to the movement arm by deforming the amplified piezoelectric ceramic stack actuators as a result of applying a voltage thereto, thereby changing an angular orientation of the substrate.

20. The method of claim 19, wherein the amplified piezoelectric ceramic stack actuator comprises:

(a) a plurality of adjacent amplified units wherein each amplified unit includes:

(i) a plurality of adjacent actuator units, each actuator unit including:

(1) a flexible non-regular octagonal loop including two first opposite surfaces and two second opposite surfaces that are oriented transversely to the two first opposite surfaces; and (2) at least one piezoelectric element disposed within the flexible non-regular octagonal loop and having an orientation so as to be in contact with the two first opposite surfaces of the flexible non-regular octagonal loop, the piezoelectric element configured to exert force on the two first opposite surfaces when a predetermined voltage is applied thereto, thereby causing the two first opposite surfaces to move apart from each other and thereby causing the two second opposite surfaces to move closer to each other, wherein each of the plurality of adjacent actuator units is oriented so that the second opposite surfaces of each flexible loop is touching a second opposite surface of an adjacent flexible loop; and (ii) a peripheral flexible non-regular octagonal loop including two peripheral first opposite surfaces and two peripheral second opposite surfaces that are oriented transversely to the two peripheral first opposite surfaces, wherein the two peripheral second opposite surfaces are touching second opposite surfaces of end ones of the plurality of adjacent actuator units, wherein application of a predetermined voltage to at least one of the actuator units causes two of the second opposite surfaces to be drawn inwardly, thereby causing the two peripheral second opposite surfaces to be drawn inwardly, thereby forcing the two peripheral first opposite surfaces apart from each other; and (b) an outer flexible loop that surrounds the plurality of amplified units.

* * * * *